United States Patent
François

(10) Patent No.: US 6,677,656 B2
(45) Date of Patent: Jan. 13, 2004

(54) HIGH-CAPACITANCE PHOTODIODE

(75) Inventor: Roy François, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/074,683

(22) Filed: Feb. 12, 2002

(65) Prior Publication Data
US 2002/0117699 A1 Aug. 29, 2002

(30) Foreign Application Priority Data
Feb. 12, 2001 (FR) .............................. 01 01883

(51) Int. Cl.[7] ...................... H01L 31/036; H01L 29/74; H01L 29/80; H01L 31/0288; H01L 31/112; H01L 31/062; H01L 31/116; H01L 29/76; H01L 29/941

(52) U.S. Cl. ................... 257/462; 257/461; 257/72; 257/225; 257/257; 257/258; 257/291; 257/292; 257/290

(58) Field of Search ................. 257/72, 222, 225, 257/257, 258, 290, 291, 292, 293, 461, 462, 90, 88, 85, 83, 84, 113, 114

(56) References Cited

U.S. PATENT DOCUMENTS

| | | |
|---|---|---|
| 4,242,694 A | 12/1980 | Koike et al. |
| 4,407,010 A | 9/1983 | Baji et al. |
| 4,630,091 A | 12/1986 | Kuroda et al. |
| 4,996,578 A | 2/1991 | Motojima et al. |
| 5,084,747 A | 1/1992 | Miyawaki |
| 5,191,399 A * | 3/1993 | Maegawa et al. ........... 257/223 |

(List continued on next page.)

FOREIGN PATENT DOCUMENTS

| | | |
|---|---|---|
| EP | 0 152 353 A1 | 8/1985 |
| EP | 0 223 136 A2 | 5/1987 |
| EP | 1 207 686 A1 | 5/2002 |
| GB | 2 276 512 A | 9/1994 |
| WO | WO 92/15036 A1 | 9/1992 |

(List continued on next page.)

OTHER PUBLICATIONS

Patent Abstracts of Japan, vol. 009, No. 262 (P–398), Oct. 19, 1985 & JP–A–60 111225 (Matsushita Denki Sangyo KK).

(List continued on next page.)

Primary Examiner—Nathan J. Flynn
Assistant Examiner—Victor A. Mandala, Jr.
(74) Attorney, Agent, or Firm—Wolf, Greenfield & Sacks, P.C.; James H. Morris

(57) ABSTRACT

A monolithic photodetector including a photodiode, a precharge MOS transistor, a control MOS transistor, a read MOS transistor, and a transfer MOS transistor, the photodiode and the transfer transistor being formed in a same substrate of a first conductivity type, the photodiode including a first region of the second conductivity type formed under a second region of the first conductivity type more heavily doped than the first region, and above a third region of the first conductivity type more heavily doped than the substrate, the first region being the source of the second conductivity type of the transfer transistor, the second and third regions being connected to the substrate and being at a fixed voltage.

22 Claims, 2 Drawing Sheets

U.S. PATENT DOCUMENTS

| | | |
|---|---|---|
| 5,237,185 A | 8/1993 | Udagawa et al. |
| 5,268,309 A | 12/1993 | Mizutani et al. |
| 5,306,931 A | 4/1994 | Stevens |
| 5,330,933 A | 7/1994 | Chan et al. |
| 5,345,266 A | 9/1994 | Denyer |
| 5,502,488 A | 3/1996 | Nagasaki et al. |
| 5,591,997 A | 1/1997 | Guidash et al. |
| 5,614,744 A | 3/1997 | Merrill |
| 5,621,230 A | 4/1997 | Guidash et al. |
| 5,747,835 A | 5/1998 | Pezzani |
| 5,831,326 A | 11/1998 | Chan et al. |
| 5,859,462 A | 1/1999 | Tredwell et al. |
| 5,881,184 A | 3/1999 | Guidash |
| 5,903,021 A * | 5/1999 | Lee et al. .................... 257/292 |
| 5,926,214 A | 7/1999 | Denyer et al. |
| 5,945,722 A | 8/1999 | Tsuei et al. |
| 5,949,061 A | 9/1999 | Guidash et al. |
| 5,978,025 A | 11/1999 | Tomasini et al. |
| 5,981,932 A | 11/1999 | Guerrieri et al. |
| 5,982,011 A | 11/1999 | Kalnitsky et al. |
| 5,986,297 A | 11/1999 | Guidash et al. |
| 6,019,848 A | 2/2000 | Frankel et al. |
| 6,049,118 A | 4/2000 | Nagano |
| 6,051,447 A | 4/2000 | Lee et al. |
| 6,067,113 A | 5/2000 | Hurwitz et al. |
| 6,069,377 A | 5/2000 | Prentice et al. |
| 6,087,703 A * | 7/2000 | Ohta et al. .................. 257/461 |
| 6,100,551 A | 8/2000 | Lee et al. |
| 6,100,556 A | 8/2000 | Drowley et al. |
| 6,107,655 A | 8/2000 | Guidash |
| 6,127,697 A | 10/2000 | Guidash |
| 6,133,954 A | 10/2000 | Jie et al. |
| 6,150,683 A | 11/2000 | Merrill et al. |
| 6,160,281 A | 12/2000 | Guidash |
| 6,160,282 A | 12/2000 | Merrill |
| 6,188,056 B1 | 2/2001 | Kalnitsky et al. |
| 6,218,656 B1 | 4/2001 | Guidash |
| 6,259,124 B1 | 7/2001 | Guidash |
| 6,352,876 B1 | 3/2002 | Bordogna et al. |
| 6,380,572 B1 | 4/2002 | Pain et al. |
| 2001/0045580 A1 | 11/2001 | Descure |
| 2002/0011638 A1 | 1/2002 | Bordogna et al. |
| 2002/0019070 A1 | 2/2002 | Laurin et al. |
| 2002/0030753 A1 | 3/2002 | Kramer et al. |
| 2002/0051067 A1 | 5/2002 | Henderson et al. |

FOREIGN PATENT DOCUMENTS

| | | |
|---|---|---|
| WO | WO 92/16999 A1 | 10/1992 |
| WO | WO 93/04556 A1 | 3/1993 |
| WO | WO 97/20434 A1 | 6/1997 |
| WO | WO 97/35438 A1 | 9/1997 |
| WO | WO 98/49729 A1 | 11/1998 |
| WO | WO 99/57887 A1 | 11/1999 |
| WO | WO 00/52765 A1 | 9/2000 |

OTHER PUBLICATIONS

Patent Abstracts of Japan, vol. 1998, No. 03, Feb. 27, 1998 & JP 09 289301 A (Nikon Corp.) Nov. 4, 1997.

Patent Abstracts of Japan, vol. 1998, No. 09, Jul. 31, 1998 & JP 10 098175 A (Toshiba Corp.).

Patent Abstracts of Japan, vol. 2000, No. 11, Jan. 2, 2001 & JP 2000 236081 A (Nikon Corp.) Aug. 29, 2000.

Furumiya M. et al., "High Sensitivity and No–Cross–Talk Pixel Technology for Embedded CMOS Image Sensor" International Electron Devices Meeting 2000, IEDM. Technical Digest, San Francisco, CA, Dec. 10–13, 2000, New York, NY: IEEE, US, Dec. 10, 2000, pp. 701–704.

French Search Report from French Patent Application 01 01883, filed Feb. 12, 2001.

Patent Abstracts of Japan, vol. 009, No. 061, Mar. 19, 1985 & JP 59 198756 A (Hitachi Seisakusho KK).

* cited by examiner

HIGH-CAPACITANCE PHOTODIODE

BACKGROUND OF THE INVENTION

1. Field of the Invention

The present invention relates to monolithic image sensors intended for being used in image pick up devices such as, for example, cameras, camcorders, digital microscopes, or digital photographic cameras. More specifically, the present invention relates to images sensors based on semiconductors including a single storage and photodetection element.

2. Discussion of the Related Art

FIG. 1 partially illustrates a portion of a line of an array of an image sensor. With each line in the array are associated a precharge device and a read device. The precharge device is formed of an N-channel MOS transistor M1, interposed between a supply rail Vdd and an end-of-line node I. The gate of precharge transistor M1 is adapted to receive a precharge control signal Rs. The read device is formed of the series connection of two N-channel MOS transistors. The drain of a first one of these read transistors, hereafter, M2, is connected to supply rail Vdd. The source of the second read transistor M3 is connected to input terminal P of an electronic processing circuit. The gate of first read transistor M2 is connected to end-of-line node I. The gate of second read transistor M3 is adapted to receiving a read signal Rd. The line includes a plurality of photodiodes. In FIG. 1, a single photodiode D2, the closest to node I, is shown. Node I is associated with a charge storage diode D1. The anode of each diode D1, D2 ... is connected to a reference supply rail or circuit ground GND. The cathode of diode D1 is directly connected to node I. Then, the cathodes of two consecutive diodes D1 and D2 are separated by a charge transfer N-channel MOS transistor, such as transistor M4 between diodes D1 and D2. The gate of transfer transistor M4 is adapted to receive a charge transfer signal T. The operation of this circuit is the following.

A photodetection cycle starts with a precharge phase during which a reference voltage level is imposed to diode D1. This precharge is performed by maintaining second read transistor M3 off and by turning on precharge transistor M1. Once the precharge has been performed, precharge transistor M1 is turned off. Then, the system is maintained as such, all transistors being off.

A given time after the end of the precharge, the state at node I, that is, the real reference charge state of diode D1 is read. To evaluate the charge state, second read transistor M3 is turned on for a very short time δt.

The cycle continues with a transfer to node I of the photogenerated charges, that is, the charges created and stored in the presence of a radiation, in upstream photodiode D2. This transfer is performed by turning transfer transistor M4 on.

Once the transfer is over, transistor M4 is turned off and photodiode D2 starts photogenerating and storing charges which will be subsequently transferred back to node I.

Simultaneously, at the end of the transfer, the new charge state of diode D1 is read. The output signal transmitted to terminal P then depends on the channel pinch of first read transistor M2, which directly depends on the charge stored in the photodiode.

Once the reading is over, transistor M3 is turned off and the cycle starts again with a precharge of diode D1.

FIG. 2 illustrates, in a partial simplified cross-section view, a monolithic forming of the assembly of a photodiode D2 and of transfer transistor M4 of FIG. 1. These elements are formed in a same active area of a semiconductor substrate 1 of a first conductivity type, for example, of type P, which is lightly doped (P−). This substrate for example corresponds to an epitaxial layer on a silicon wafer. The active area is delimited by field insulating layers 2, for example made of silicon oxide (SiO2) and corresponds to a well 3 of the same conductivity type as underlying substrate 1, but more heavily doped. Above the surface of well 3 is formed an insulated gate structure 4 possibly provided with lateral spacers. On either side of gate 4, at the surface of well 3, are located source and drain regions 5 and 6 of the opposite conductivity type, for example, N. Drain region 6, to the right of gate 4, is heavily doped (N+). Source region 5 is formed on a much larger surface area than drain region 6 and forms with underlying substrate 3 the junction of photodiode D2. Gate 4 and drain 6 are solid with metallizations (not shown) which enable putting in contact these regions with transfer control signal T and the gate of transistor M2 (node I), respectively. The structure is completed by heavily-doped P-type regions 8 and 9 (P+). Regions 8 and 9, underlying areas 2, are connected to the reference or ground voltage via well 3 and substrate 1. Photodiode D2 is of the so-called completely depleted type and includes, at the surface of its source 5, a shallow very heavily-doped P-type region 7 (P+). Region 7 is in lateral (vertical) contact with region 8. It is thus permanently maintained at the reference voltage level.

FIG. 3 illustrates the voltage levels of the various regions of FIG. 2. The curve in full line illustrates the system state after a transfer, after transistors M4 and M1 have been turned on. Photodiode D2 reaches a so-called depletion quiescent level VD determined by the sole characteristics of the diode, as will be explained in further detail hereafter. Heavily-doped P-type regions 7, 8, and 9 are continuously maintained at the reference or ground voltage, for example, 0 V. Channel region 3 of transistor M4 is at a voltage Vdd-VT. Region 6 (node I) is at Vdd. When transistor M4 is off, its channel region switches to 0 V (dotted line). Region 5 of photodiode D2 then forms a voltage well, which fills up (dotted line) according to the lighting of this photodiode. Then, when transistor M4 turns back on (transistor M1 being maintained off), the charges accumulated in region 5 are transferred to region 6, the voltage of which varies (dotted line).

The use of a photodiode D2 (FIGS. 1, 2) of completely depleted type enables suppressing or eliminating any noise at the level of photodiode D2. For this purpose, the doping profiles are chosen so that region 5, pinched between surface region 7 and underlying substrate 3, is depleted. Voltage VD in depletion state, that is, in the absence of any radiation, is adjusted only by the doping of regions 7, 5, and 3. This voltage is chosen, as illustrated in FIG. 3, at a value smaller than the channel voltage of transfer transistor M4 during the transfer of charges from the photodiode to node I.

A disadvantage of such photodiodes is the fact that their capacitance is relatively low. This is particularly disadvantageous with the decrease in supply voltages Vdd in CMOS technologies. Indeed, a supply reduction from 5 to 3.3 V imposes setting the depletion voltage VD of photodiode D2 to approximately 1 V. The capacitance associated with this diode then is too low to obtain sufficient dynamics.

SUMMARY OF THE INVENTION

The present invention thus aims at providing a photodiode having an increased capacitance.

To achieve this and other objects, the present invention provides a photodetector made in monolithic form, of the type including a photodiode, a precharge MOS transistor, a control MOS transistor, a read MOS transistor, and a transfer MOS transistor, the photodiode and the transfer transistor being formed in a same substrate of a first conductivity type, the photodiode including a first region of the second conductivity type formed under a second region of the first conductivity type more heavily doped than the first region, and above a third region of the first conductivity type more heavily doped than the substrate, the first region being the source of the second conductivity type of the transfer transistor, the second and third regions being connected to the substrate and being at a fixed voltage.

According to an embodiment of the present invention, the photodetector further includes a well of the first conductivity type, more heavily doped than the substrate, in which the first region is formed.

According to an embodiment of the present invention, the first conductivity type is type P and the second conductivity type is type N.

According to an embodiment of the present invention, the substrate, the well, and the second and third regions are maintained to a reference voltage of the circuit.

According to an embodiment of the present invention, the photodetector includes chains of photodiodes connected together by transfer transistors.

According to an embodiment of the present invention, the third region has a thickness such that it is an integral part of the space charge area between the first and third regions.

The foregoing objects, features and advantages of the present invention will be discussed in detail in the following non-limiting description of specific embodiments in connection with the accompanying drawings.

DETAILED DESCRIPTION

Figure 1:
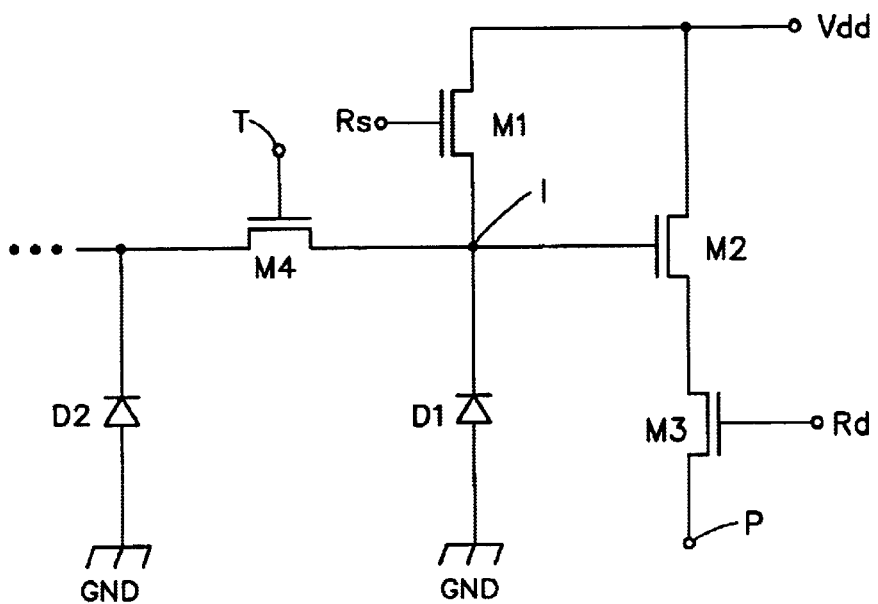
FIG. 1 is a schematic electric diagram of an image sensor.
Figure 2:
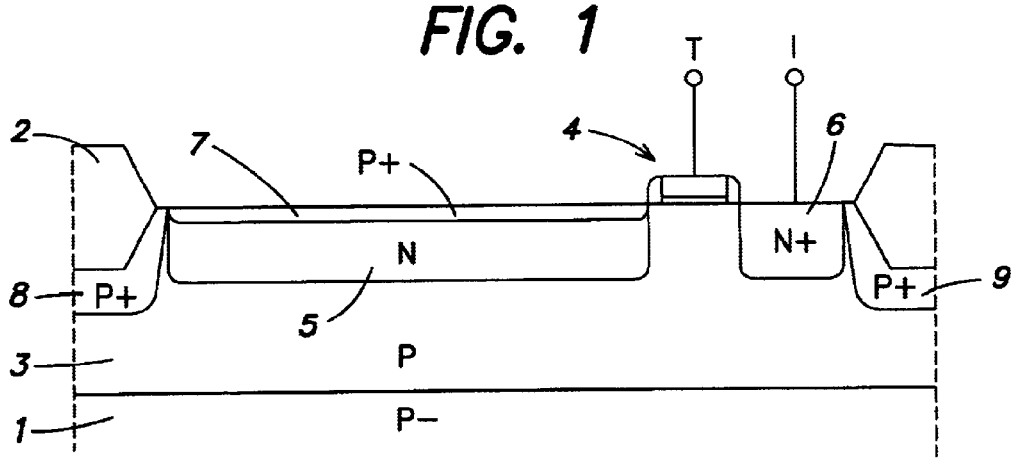
FIG. 2 is a partial simplified cross-section view of a portion of the circuit of FIG. 1 made in monolithic form according to prior art.
Figure 3:
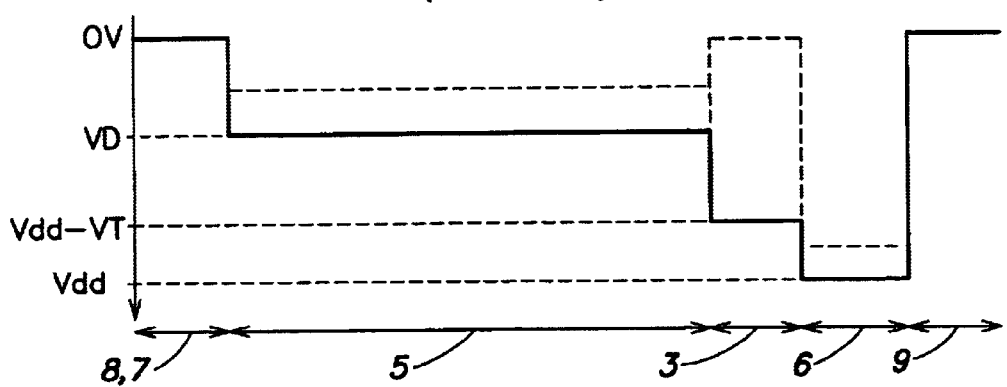
FIG. 3 illustrates voltage levels in the structure of FIG. 2.
Figure 4:
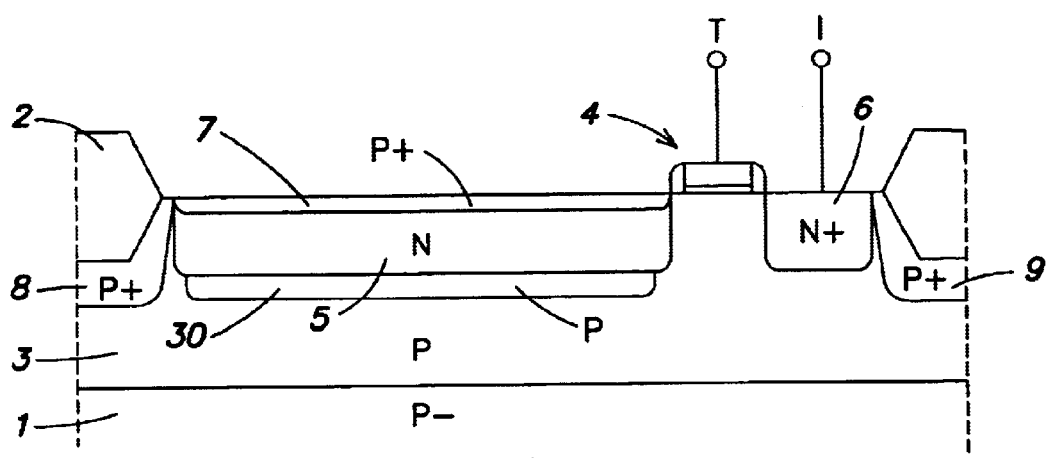
FIG. 4 illustrates, in a partial simplified cross-section view, the forming of a portion of the circuit of FIG. 1 according to an embodiment of the present invention.

The same elements have been designated with the same references in the different drawings and, further, as usual in the representation of integrated circuits, FIGS. 2 and 4 are not drawn to scale.

A feature of the present invention is to modify the structure of each photodiode in the way described hereafter in relation with FIG. 4.

According to the present invention, a P-type buried region 30 is formed under the bottom of cathode region 5 of diode D2. Buried region 30 thus is of the same conductivity type as peripheral well 3 and as substrate 1 (anode of diode D2). However, buried region 30 is more heavily doped than well 3. The surface of source 5 includes a heavily-doped P-type shallow region 7. Buried region 30 is more lightly doped than region 7.

The operating cycle of the photodiode according to the present invention is similar to that described previously. The variation of the voltage levels upon transfer from diode D2 to node I also remains unchanged.

However, the photodiode according to the present invention advantageously has an increased capacitance. Indeed, the presence of buried region 30 reduces the extent of the space charge area in P-type region. By providing a region 30 more heavily doped than peripheral well 3, a non-negligible capacitance, greater than for a conventional homologous junction between a source region 5 and well 3 or substrate 1, will be obtained. The presence of region 30 adds a charge storage capacitance in parallel with the capacitance associated with the presence of surface region 7. Accordingly, the maximum charge that can be stored in a photodiode D2, for a same supply voltage level, is increased with respect to a conventional photodiode.

Figure 5A:
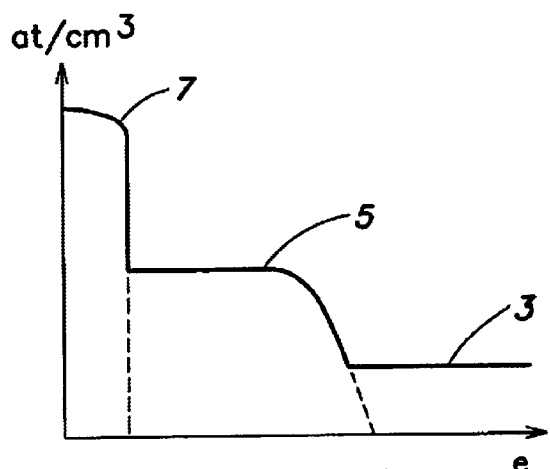
FIGS. 5A and 5B illustrate doping levels in the structures of FIGS. 2 and 4, respectively.
Figure 5B:
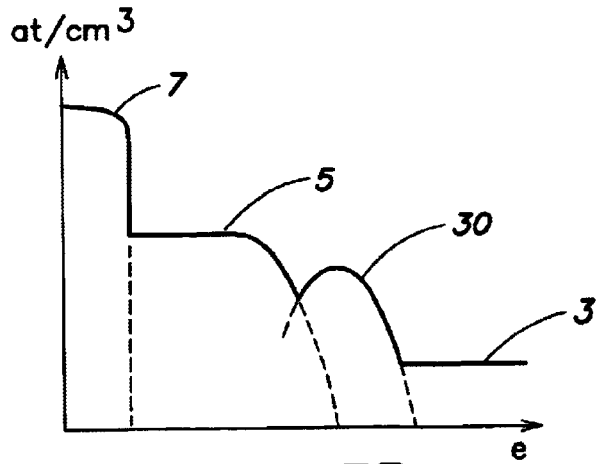

Further, the present of buried region 30 enables ensuring depletion of source region 5 while the doping level thereof is increased with respect to a conventional structure. Such a doping increase of region 5 causes an increase in the capacitance associated with the region 5/region 7 junction. FIGS. 5A and 5B illustrate the doping levels according to thickness e in a conventional photodiode such as illustrated in FIG. 2 and in a photodiode according to the present invention such as illustrated in FIG. 4, respectively.

Preferably, the thickness of region 30 is chosen so that, in the quiescent state, region 30 is completely depleted. In other words, the thickness of region 30 is chosen so that region 30 is an integral part of the space charge area between region 5 and region 30.

The increase in the capacitance associated with photodiode D2, and thus in the maximum charge that can be stored, is particularly advantageous. Indeed, increasing the number of charges that can be stored amounts to increasing the useful signal proportion. The dynamics, that is, the signal-to-noise ratio, is thus considerably improved. In practical words, this means that the contrast is improved and that the photodetectors can operate in a wider lighting range. Indeed, with conventional devices, the saturation, that is, the maximum amount of charges that can be reached, is reached very quickly.

Of course, the present invention is likely to have various alterations, modifications, and improvements which will readily occur to those skilled in the art. In particular, those skilled in the art will know how to adjust the doping levels and types to the desired performances and to the materials used according to the constraints of a specific manufacturing technology.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A monolithic photodetector including a photodiode, a precharge MOS transistor, a control MOS transistor, a read MOS transistor, and a transfer MOS transistor, the photodiode and the transfer MOS transistor being formed in a same area of a substrate of a first conductivity type, wherein the photodiode includes a first region of the second conductivity type formed under a second region of the first conductivity type more heavily doped than the first region, and above a third region of the first conductivity type more heavily doped than the area, the first region being a source of the transfer MOS transistor, wherein the transfer MOS transistor includes a drain that is formed by a fourth region that is formed in the area and is spaced from the first, second and third regions, the second and third regions being connected to the substrate and being at a fixed voltage.

2. The photodetector of claim 1, wherein the area is a well of the first conductivity type formed in the substrate and is more heavily doped than the substrate.

3. The photodetector of claim 1, wherein the first conductivity type is type P and the second conductivity type is type N.

4. The photodetector of claim 2, wherein the substrate, the well, and the second and third regions are maintained to a reference voltage of the circuit.

5. The photodetector of claim 1, including chains of photodiodes connected together by transfer transistors.

6. The photodetector of claim 1, wherein the third region has a thickness such that it is an integral part of the space charge area between the first and third regions.

7. An integrated circuit, comprising:
   a first region of a first conductivity type;
   a photodiode, formed within the first region, comprising a second region of the first conductivity type, a third region of a second conductivity type fanned under the second region, and a fourth region of the first conductivity type formed under the third region, wherein the fourth region is more heavily doped than the first region; and
   a transistor comprising a source formed by the third region and a drain formed by a fifth region formed within the first region and spaced from the second, third and fourth regions.

8. The integrated circuit of claim 7, wherein the transistor is a transfer transistor for transferring charge from the source to the drain.

9. The integrated circuit of claim 7, wherein the first region is a well, and wherein the integrated circuit further comprises a substrate within which the well is formed.

10. The integrated circuit of claim 7, further comprising a substrate of a first conductivity type in which the first region is formed, wherein the substrate, the first region, the second region and the fourth region are maintained at a reference voltage of the integrated circuit.

11. The integrated circuit of claim 7, wherein the first conductivity type is a P-type conductivity type and the second conductivity type is an N-type conductivity type.

12. The integrated circuit of claim 7, wherein the fourth region has a sufficient thickness to form an integral part of the space charge area between the second and fourth regions.

13. The integrated circuit of claim 7, in combination with a plurality of photodiodes to form a photodetector.

14. The integrated circuit of claim 7, wherein the second region is more heavily doped than the fourth region.

15. A method of increasing a capacitance of a photodiode formed within a first region of a first conductivity type of an integrated circuit, the photodiode including a second region of the first conductivity type and a third region of a second conductivity type formed under the second region, and the integrated circuit including a transistor comprising a source formed by the third region and a drain formed by a fourth region that is formed within the first region and is spaced from the second and third regions, the method comprising an act of:
   forming, between the first region and the third region and spaced from the fourth region, a fifth region of the first conductivity type that is more heavily doped than the first region.

16. The method of claim 15, wherein the act of forming comprises forming the fifth region between the first region and the third region that forms the source of the transistor, wherein the transistor is a transfer transistor for transferring charge from the source of the transistor to the drain of the transistor.

17. The method of claim 15, wherein the act of forming comprises forming the fifth region between the third region and the first region, wherein the first region is a well and the integrated circuit includes a substrate within which the well is formed.

18. The method of claim 15, wherein the integrated circuit further includes a substrate of a first conductivity type in which the first region is formed, and wherein the substrate, the first region and the second region are maintained at a reference voltage of the integrated circuit, the act of forming including:
   forming the fifth region such that the fifth region is maintained at the reference voltage of the integrated circuit.

19. The method of claim 15, wherein the act of forming comprises forming the fifth region of the first conductivity type, wherein the first conductivity type is a P-type conductivity type and the second conductivity type is an N-type conductivity type.

20. The method of claim 15, the act of forming including:
   forming the fifth region with a sufficient thickness to form an integral part of the space charge area between the second and fifth regions.

21. The method of claim 15, wherein the act of forming comprises forming the fifth region within an integrated circuit, wherein the integrated circuit is in combination with a plurality of diodes to form a photodetector.

22. The method of claim 15, the act of forming including:
   forming the fifth region to be more lightly doped than the second region.

* * * * *

UNITED STATES PATENT AND TRADEMARK OFFICE
CERTIFICATE OF CORRECTION

PATENT NO.   : 6,677,656 B2
DATED        : January 13, 2004
INVENTOR(S)  : François Roy It is certified that error appears in the above-identified patent and that said Letters Patent is hereby corrected as shown below:

<u>Column 5,</u>
Line 23, should read:
-- region of a second conductivity type formed under the --

Signed and Sealed this

Sixth Day of April, 2004

JON W. DUDAS
*Acting Director of the United States Patent and Trademark Office*

UNITED STATES PATENT AND TRADEMARK OFFICE
CERTIFICATE OF CORRECTION

PATENT NO.    : 6,677,656 B2
DATED         : January 13, 2004
INVENTOR(S)   : François Roy It is certified that error appears in the above-identified patent and that said Letters Patent is hereby corrected as shown below:

<u>Title page,</u>
Item [75], should read -- [75] Inventor: François Roy, Grenoble (FR) --

Signed and Sealed this

Twentieth Day of July, 2004

JON W. DUDAS
*Acting Director of the United States Patent and Trademark Office*